US011803126B2

(12) United States Patent
Teng et al.

(10) Patent No.: US 11,803,126 B2
(45) Date of Patent: Oct. 31, 2023

(54) METHOD OF COMPENSATING WAVELENGTH ERROR INDUCED BY REPETITION RATE DEVIATION

(71) Applicant: Cymer, LLC, San Diego, CA (US)

(72) Inventors: Kuo-Tai Teng, Poway, CA (US); Rahul Ahlawat, San Diego, CA (US)

(73) Assignee: Cymer, LLC, San Diego, CA (US)

( * ) Notice: Subject to any disclaimer, the term of this patent is extended or adjusted under 35 U.S.C. 154(b) by 0 days.

(21) Appl. No.: 17/627,844

(22) PCT Filed: Jun. 25, 2020

(86) PCT No.: PCT/US2020/039520
§ 371 (c)(1),
(2) Date: Jan. 18, 2022

(87) PCT Pub. No.: WO2021/015919
PCT Pub. Date: Jan. 28, 2021

(65) Prior Publication Data
US 2022/0269181 A1 Aug. 25, 2022

Related U.S. Application Data

(60) Provisional application No. 62/877,796, filed on Jul. 23, 2019.

(51) Int. Cl.
*G03F 7/20* (2006.01)
*G03F 7/00* (2006.01)
(Continued)

(52) U.S. Cl.
CPC ...... *G03F 7/70025* (2013.01); *G03F 7/70575* (2013.01); *H01S 3/08004* (2013.01); *H01S 3/10046* (2013.01)

(58) Field of Classification Search
CPC ............. G03F 7/70025; G03F 7/70575; H01S 3/08004; H01S 3/10046; H01S 3/1305;
(Continued)

(56) References Cited

U.S. PATENT DOCUMENTS 5,142,543 A 8/1992 Wakabayashi et al.
6,671,294 B2 12/2003 Kroyan et al.
(Continued)

FOREIGN PATENT DOCUMENTS

JP 2003031881 A 1/2003
JP 2004526313 A5 12/2005
(Continued)

OTHER PUBLICATIONS

Robert Laenen, European International Searching Authority, International Search Report and Written Opinion, corresponding PCT Application No. PCT/US2020/039520, dated Sep. 25, 2020, 11 pages total.
(Continued)

*Primary Examiner* — Mesfin T Asfaw
(74) *Attorney, Agent, or Firm* — DiBerardino McGovern IP Group LLC

(57) ABSTRACT

A radiation system for controlling pulses of radiation comprising an optical element configured to interact with the pulses of radiation to control a characteristic of the pulses of radiation, an actuator configured to actuate the optical element according to a control signal received from a controller, the control signal at least partially depending on a reference pulse repetition rate of the radiation system and, a processor configured to receive pulse information from the controller and use the pulse information to determine an adjustment to the control signal. The radiation system may be used to improve an accuracy of a lithographic apparatus operating in a multi-focal imaging mode.

18 Claims, 10 Drawing Sheets

(51) Int. Cl.
*H01S 3/08* (2023.01)
*H01S 3/10* (2006.01)

(58) Field of Classification Search
CPC .... H01S 3/137; H01S 3/1055; H01S 3/10069;
H01S 3/225; H01S 3/2308; H01S 3/104;
H01S 3/09705; H01S 3/134; H01S
3/2256; H01S 3/2251; H01S 3/22; H01S
3/139; H01S 2301/02; H01S 3/036; H01S
3/0971

See application file for complete search history.

(56) References Cited

U.S. PATENT DOCUMENTS

| | | |
|---|---|---|
| 6,829,040 B1 | 12/2004 | Kye et al. |
| 6,853,653 B2 | 2/2005 | Spangler et al. |
| 6,952,253 B2 | 10/2005 | Lof et al. |
| 7,088,758 B2 | 8/2006 | Sandstrom et al. |
| 7,154,928 B2 | 12/2006 | Sandstrom et al. |
| 7,256,870 B2 | 8/2007 | Finders |
| 7,286,207 B2 | 10/2007 | Nolscher et al. |
| 7,525,638 B2 | 4/2009 | Buurman et al. |
| 7,534,552 B2 | 5/2009 | De Kruif et al. |
| 7,612,868 B2 | 11/2009 | Tsuchiya |
| 8,705,004 B2 | 4/2014 | Butler et al. |
| 8,989,225 B2 | 3/2015 | Kakizaki et al. |
| 9,207,119 B2 | 12/2015 | Rokitski et al. |
| 9,235,136 B2 | 1/2016 | Epple |
| 9,261,794 B1 | 2/2016 | Ahlawat |
| 9,989,866 B2 | 6/2018 | Mason et al. |
| 2002/0006149 A1 | 1/2002 | Spangler et al. |
| 2002/0048288 A1 | 4/2002 | Kroyan et al. |
| 2002/0154669 A1 | 10/2002 | Spangler et al. |
| 2005/0083983 A1 | 4/2005 | Sandstrom et al. |
| 2006/0261050 A1 | 11/2006 | Krishnan et al. |
| 2007/0013889 A1 | 1/2007 | Jorritsma et al. |
| 2007/0222961 A1 | 9/2007 | Schmidt |
| 2016/0299441 A1 | 10/2016 | Ahlawat |
| 2016/0341602 A1 | 11/2016 | Thornes |
| 2016/0380402 A1* | 12/2016 | O'Brien .............. G03F 7/70141 359/342 |
| 2017/0160638 A1 | 6/2017 | O'Brien et al. |
| 2018/0109068 A1 | 4/2018 | Conley et al. |
| 2018/0323568 A1 | 11/2018 | Furusato et al. |

FOREIGN PATENT DOCUMENTS

| | | |
|---|---|---|
| JP | 2017538963 A | 12/2017 |
| KR | 20180012828 A | 2/2018 |
| KR | 20190057397 A | 5/2019 |
| TW | 492234 B | 6/2002 |
| WO | 2008052153 A2 | 5/2008 |
| WO | 2009018664 A2 | 2/2009 |
| WO | 2019079010 A1 | 4/2019 |
| WO | 2019174885 A1 | 9/2019 |
| WO | 2019190700 A1 | 10/2019 |

OTHER PUBLICATIONS

Office Action, counterpart Japanese Patent Application No. 2022-502017, dated Apr. 4, 2023, 7 pages total (including English translation of 4 pages).

KIPO, Office Action, counterpart Korean Patent Application No. 10-2022-7002548, dated May 11, 2023, 13 pages total (including English translation of 5 pages).

* cited by examiner

METHOD OF COMPENSATING WAVELENGTH ERROR INDUCED BY REPETITION RATE DEVIATION

CROSS REFERENCE TO RELATED APPLICATIONS

This application claims priority to U.S. Application No. 62/877,796, filed Jul. 23, 2019 and titled METHOD OF COMPENSATING WAVELENGTH ERROR INDUCED BY REPETITION RATE DEVIATION, which is incorporated herein in its entirety by reference.

FIELD

This disclosure relates to systems and methods for generating pulses of radiation for use, for example, in a lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the number of functional elements, such as transistors, per device has been steadily increasing over decades, following a trend commonly referred to as 'Moore's law'. To keep up with Moore's law the semiconductor industry is chasing technologies that enable the creation of increasingly smaller features. To project a pattern on a substrate, a lithographic apparatus may use electromagnetic radiation. The wavelength of this radiation determines the minimum size of features which are patterned into the resist on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

Generally, an excimer laser is designed to operate with a specific gas mixture; therefore, changing wavelength can be complicated. In particular, changing the centre wavelength from one discharge to the next ("pulse-to-pulse") is challenging. There may be instances, however, where it is desired to have the ability to change wavelength. For example, in 3D NAND tiers of memory (that is, memory in which the structure resembles NAND ("NOT-AND") gates stacked on top of each other). The transition from 2D to 3D NAND architecture requires significant changes in manufacturing processes. In 3D NAND fabrication the challenges are driven primarily by the processes of etching and deposition at extreme aspect ratios (i.e. the ratio of a hole diameter to its depth). Creating complex 3D structures with very high-aspect-ratio (HAR) features is complicated and requires extreme precision and, ultimately, process uniformity and repeatability to achieve scale. Moreover, as multi-layered stack heights increase, so does the difficulty in achieving consistent etch and deposition results at the top and the bottom of the stack, e.g., a memory array.

These considerations lead to a need for a greater depth of focus. Lithography depth of focus DOF, for single-wavelength light, is determined by the relationship $DOF=\pm m_2 \lambda/(NA)^2$ where $\lambda$ is the wavelength of the illuminating light, NA is numerical aperture, and $m_2$ is a practical factor depending on the resist process. Due to greater depth-of-focus requirements in 3D NAND lithography, sometimes more than one exposure pass is made over a wafer using a different laser wavelength for each pass.

In addition, the materials making up the lenses that focus the laser radiation are dispersive so different wavelengths come to focus at different depths in the resist. This is another reason why it may be desirable to have the ability to change wavelengths.

A radiation system, such as a deep ultraviolet (DUV) radiation system, includes systems for controlling the wavelength of generated radiation. Typically these wavelength control systems include feedback and feed-forward compensators to promote wavelength stability. Characteristically it is expected that the target or reference wavelength, that is, the wavelength commanded by the wavelength control system, will not change rapidly during laser operation. The compensators are therefore primarily engaged in rejecting transient disturbances. The feed-forward compensator also compensates for commanded changes in the wavelength target, that is, wavelength change events, which are expected to be infrequent. When such an event occurs, for example, to achieve a wavelength set point change of 600 fm, typically a settling time on the order of about 100 ms must be allowed for the system to settle stably to the new wavelength. This normally exceeds the time between pulses (typically around 1 ms or less) so that under the use case where target wavelength set point is changed about 500 fm between pulses, such a control system will not be able to provide the desired pulse-to-pulse wavelength tracking performance.

As a specific example, in an application of generating DUV light at two different wavelengths, the reference wavelength has two set points during exposure, that is, a first set point at a first wavelength and a second set point at a second wavelength. The reference wavelength will then be modulated between these two set points.

It would be desirable to have the ability to generate pulses of radiation having a controlled characteristic, such as wavelength. It would be desirable to change the controlled characteristic between pulses of radiation, that is, on a pulse-to-pulse basis. It would also be desirable to reduce or even eliminate errors which may reduce an accuracy of the controlled characteristic.

SUMMARY

According to a first aspect, there is provided a radiation system for controlling pulses of radiation comprising an optical element configured to interact with the pulses of radiation to control a characteristic of the pulses of radiation, and an actuator configured to actuate the optical element according to a control signal received from a controller. The control signal at least partially depends on a reference pulse repetition rate of the radiation system. The controller is configured to receive pulse information and use the pulse information to determine and apply an adjustment to the control signal.

In various implementations, the radiation system may reduce an error associated with the characteristic of the pulses of radiation, thereby improving an accuracy of the radiation system compared to known radiation systems.

The optical element may be reflective or transmissive. The controller may receive pulse information from an apparatus that is receiving the controlled pulses of radiation for a given purpose, e.g. a lithographic apparatus for use in a lithographic exposure.

The reference pulse repetition rate of the radiation system may be pre-determined and/or fixed.

The pulse information may include an operational pulse repetition rate and/or a pulse number. The operational pulse repetition rate may differ from the reference pulse repetition rate. For example, the operational pulse repetition rate may differ from the reference pulse repetition rate by an intended amount to alter an energy dose provided by generated pulses of radiation. The pulse information may be determined offline and provided to the controller when needed. Alternatively the pulse information may be determined during operation of the radiation system.

The adjustment may change a phase of the control signal.

The characteristic may be a wavelength of the pulses of radiation.

Controlling (e.g. changing) a wavelength of pulses of radiation is desirable in many different optical systems. For example, a lithographic system operating in multi-focal imaging mode will alter between different wavelengths of radiation between different pulses of radiation. The radiation system may reduce a wavelength error of the pulses of radiation, thereby improving an accuracy of, for example, a lithographic system comprising the radiation system.

The pulse information may include an operational pulse repetition rate of the radiation system and the adjustment may at least partially account for a difference between the reference pulse repetition rate and the operational pulse repetition rate.

Differences between the reference pulse repetition rate and the operational pulse repetition rate may be intentional (e.g. to alter an energy dose of the pulses of radiation) and/or unintentional (e.g. thermal errors affecting components of the radiation system). These differences may cause an error in a desired characteristic (e.g. a wavelength) of the pulses of radiation because the actuator may no longer be in a desired synchronization with the pulses of radiation. The radiation system may reduce the error of the characteristic of the pulses of radiation resulting from the difference between the reference pulse repetition rate and the operational pulse repetition rate.

The adjustment may change, for example, a magnitude or an amplitude of the control signal.

The adjustment may change a phase of the control signal. However, actuators in some radiation systems tend to be underdamped because the actuators oscillate at such high frequencies (e.g. about 60 kHz or more). Thus, changing the phase of the control signal for an underdamped actuator is likely to introduce significant transient oscillation that introduces errors of its own. Changing a magnitude of the control signal may reduce the errors associated with the characteristic of the pulses of radiation without incurring the downsides associated with changing a phase of the control signal.

The magnitude of the control signal may be:

$$|U(f)| = \frac{\lambda_T(n)}{|P(f)|}$$

where U (f) is the control signal of the actuator in the frequency domain, $\lambda_T$ is a target wavelength of the pulses of radiation, n is the pulse number and P(f) is a dynamic model of the actuator in the frequency domain.

The pulse information may include a pulse number. The changed magnitude of the control signal may be:

$$|U(f)|_A = \frac{\lambda_T(n)}{|P(f)|} \times C$$

where C is a correction factor.

The correction factor may be:

$$C = \frac{1}{\cos(2\pi \times R_r \times \Delta \times n)}$$

where $R_r$ is the reference pulse repetition rate of the radiation system and $\Delta$ is a difference between the operational pulse repetition rate and the reference pulse repetition rate.

The correction factor may be predictable from known and (offline) measurable quantities. The inventors have found that, surprisingly, the correction factor is an invertible component of the overall wavelength peak separation error. The correction factor may be applied to existing actuator control signals to yield (ideally) zero induced error from pulse repetition rate deviations. The correction factor may reduce a wavelength error of the pulses of radiation.

The correction factor may be calculated and applied to the control signal for each pulse of radiation generated by the radiation system.

The actuator may comprise a piezoelectric element configured to rotate the optical element such that an angle of incidence of the pulses of radiation on the optical element changes.

The optical element may comprise a grating configured to reflect the pulses of radiation in a wavelength dependent manner such that a selected band of wavelengths of radiation are transmitted to an output of the radiation system.

The selected band of wavelengths that are transmitted to the output of the radiation system may depend upon an angle of incidence of the pulses of radiation with respect to the grating.

The optical element may comprise a prism configured to refract the pulses of radiation in a wavelength dependent manner such that a selected band of wavelengths of radiation are transmitted to the output of the radiation system.

The selected band of wavelengths that are transmitted to the output of the radiation system may depend upon an angle of incidence of the pulses of radiation with respect to the prism.

According to a second aspect, there is provided a lithographic system comprising a lithographic apparatus configured to receive pulses of radiation, pattern the pulses of radiation and project the patterned pulses of radiation onto a target, and a radiation system according to the first aspect.

In various implementations, a radiation system improves an accuracy of a lithographic apparatus operating in a multi-focal imaging mode by reducing wavelength error of the pulses of radiation that are projected onto the target. In various implementations, a radiation system increases a range of repetition rates that are compatible with a multi-focal imaging lithographic system by, for example, at least about ±10 Hz. In various implementations, a radiation system reduces the risk of throughput loss for the lithographic system due to, for example, wavelength errors, and avoids the need for significant and expensive modification to the lithographic system's control software.

According to a third aspect, there is provided a method of controlling pulses of radiation comprising using an optical element to interact with the pulses of radiation to control a characteristic of the pulses of radiation, using an actuator to actuate the optical element according to a control signal that at least partially depends on a reference pulse repetition rate of the radiation system, receiving pulse information, and using the pulse information to determine and apply an adjustment to the control signal.

The characteristic may be a wavelength of the pulses of radiation.

The pulse information may include an operational pulse repetition rate of the radiation system and the adjustment may at least partially account for a difference between the reference pulse repetition rate and the operational pulse repetition rate.

The adjustment may change a magnitude of the control signal.

The magnitude of the control signal may be:

$$|U(f)| = \frac{\lambda_T(n)}{|P(f)|}$$

where U(f) is the control signal of the actuator, $\lambda_T$ is a target wavelength of the pulses of radiation, n is the pulse number and P(f) is a dynamic model of the actuator.

The pulse information may include a pulse number. The changed magnitude of the control signal may be:

$$|U(f)|_A = \frac{\lambda_T(n)}{|P(f)|} \times C$$

where C is a correction factor.
The correction factor may be:

$$C = \frac{1}{\cos(2\pi \times R_r \times \Delta \times n)}$$

where $R_r$ is the reference pulse repetition rate of the radiation system and $\Delta$ is a difference between the operational pulse repetition rate and the reference pulse repetition rate.

The correction factor may be calculated and applied to the control signal for each pulse of radiation generated by the radiation system.

According to a fourth aspect, there is provided a method of projecting a patterned beam of radiation onto a target, wherein the patterned beam of radiation comprises pulses of radiation, the method further comprising controlling the pulses of radiation according to the method of the third aspect.

According to a fifth aspect, there is provided a computer program comprising computer readable instructions configured to cause a computer to carry out a method according to the third and/or fourth aspects.

According to a sixth aspect, there is provided a computer readable medium carrying a computer program according to the fifth aspect.

According to a seventh aspect, there is provided a computer apparatus for controlling pulses of radiation comprising a memory storing processor readable instructions, and a processor arranged to read and execute instructions stored in said memory, wherein said processor readable instructions comprise instructions arranged to control the computer to carry out a method according to the third and/or fourth aspects.

BRIEF DESCRIPTION OF THE DRAWINGS

Various versions of systems and methods will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
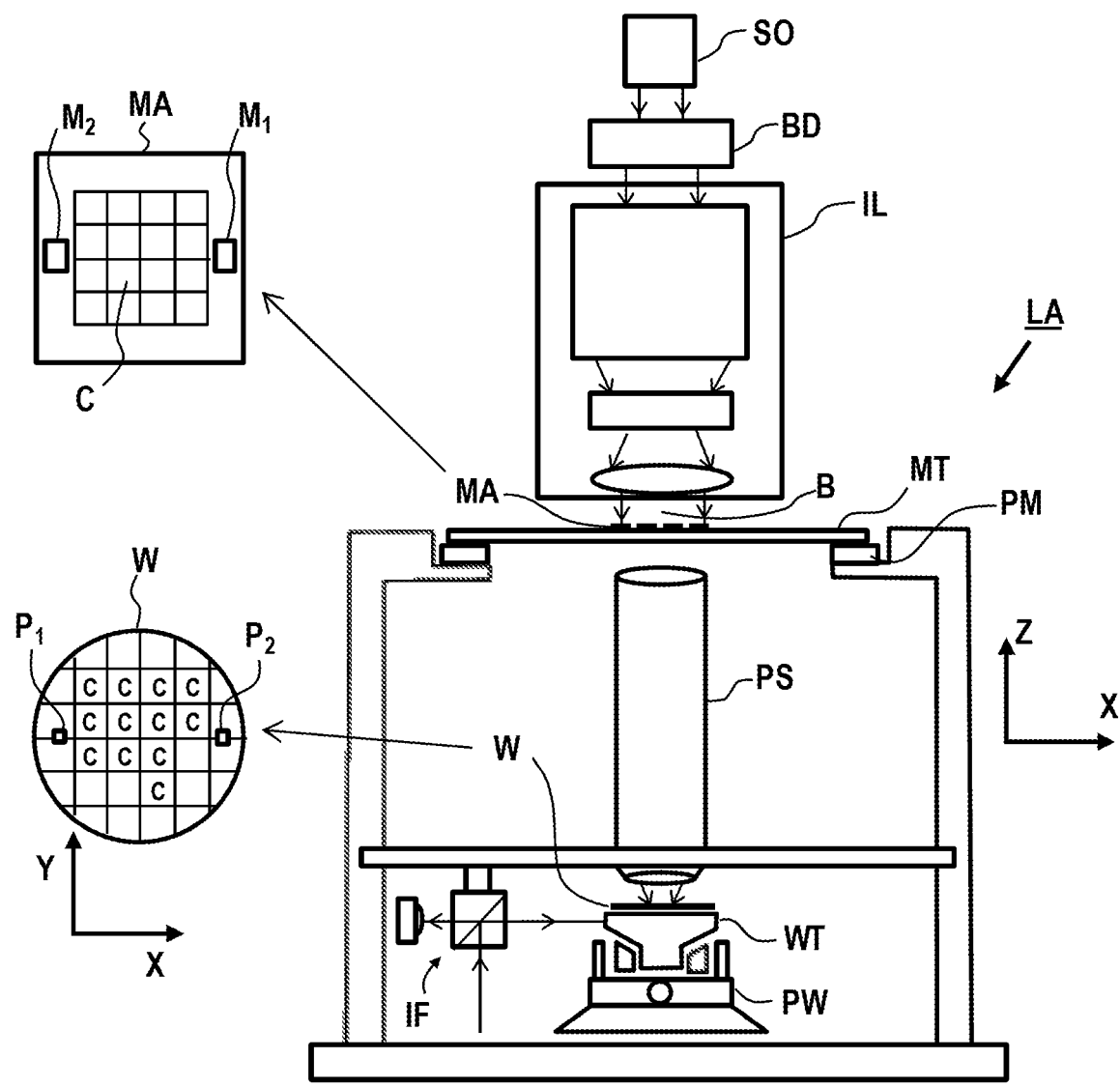
FIG. 1 schematically depicts an overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machines, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. a mask MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify, a Cartesian coordinate system is used. The Cartesian coordinate system has three axis, i.e., an x-axis, a y-axis and a z-axis. Each of the three axes is orthogonal to the other two axes. A rotation around the x-axis is referred to as an Rx-rotation. A rotation around the y-axis is referred to as an Ry-rotation. A rotation around the z-axis is referred to as an Rz-rotation. The x-axis and the y-axis define a horizontal plane, whereas the z-axis is in a vertical direction. The Cartesian coordinate system does not limit the invention and is used for clarification only. Instead, another coordinate system, such as a cylindrical coordinate system, may be used to clarify. The orientation of the Cartesian coordinate system may be different, for example, such that the z-axis has a component along the horizontal plane.

Figure 2:
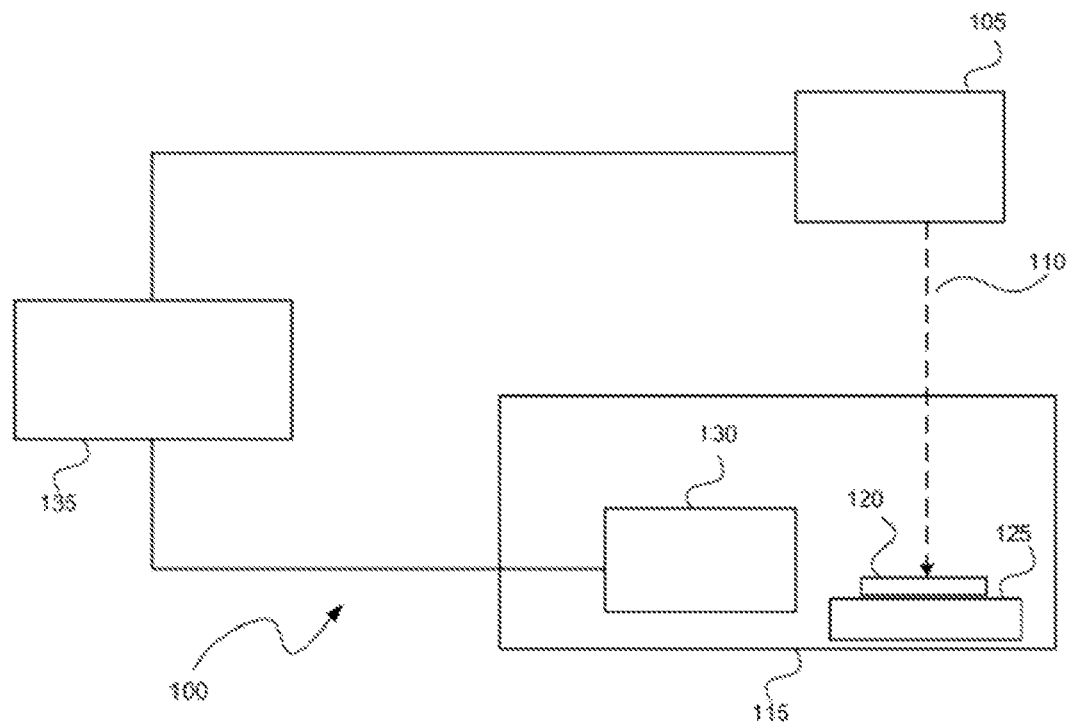
FIG. 2 schematically depicts a view of an overall broad conception of a photolithography system according to an aspect of the disclosed subject matter.

FIG. 2 schematically depicts a photolithography system 100 which includes an illumination system 105. As described more fully below, the illumination system 105 includes a light source that produces a pulsed light beam 110 and directs it to a photolithography exposure apparatus or scanner 115 that patterns microelectronic features on a wafer 120. The wafer 120 is placed on a wafer table 125 constructed to hold the wafer 120 and connected to a positioner configured to accurately position the wafer 120 in accordance with certain parameters.

The photolithography system 100 uses a light beam 110 having a wavelength in the deep ultraviolet (DUV) range, for example, with wavelengths of 248 nanometres (nm) or 193 nm. The minimum size of the microelectronic features that can be patterned on the wafer 120 depends on the wavelength of the light beam 110, with a lower wavelength permitting a smaller minimum feature size. When the wavelength of the light beam 110 is 248 nm or 193 nm, the minimum size of the microelectronic features can be, for example, 50 nm or less. The bandwidth of the light beam 110 can be the actual, instantaneous bandwidth of its optical spectrum (or emission spectrum), which contains information on how the optical energy of the light beam 110 is distributed over different wavelengths. The scanner 115 includes an optical arrangement having, for example, one or more condenser lenses, a mask, and an objective arrangement. The mask is movable along one or more directions, such as along an optical axis of the light beam 110 or in a plane that is perpendicular to the optical axis. The objective arrangement includes a projection lens and enables the image transfer to occur from the mask to the photoresist on the wafer 120. The illumination system 105 adjusts the range of angles for the light beam 110 impinging on the mask. The illumination system 105 also homogenizes (makes uniform) the intensity distribution of the light beam 110 across the mask.

The scanner 115 can include, among other features, a lithography controller 130, air conditioning devices, and power supplies for the various electrical components. The lithography controller 130 controls how layers are printed on the wafer 120. The lithography controller 130 includes a memory that stores information such as process recipes. A process program or recipe determines the length of the exposure on the wafer 120 based on, for example, the mask used, as well as other factors that affect the exposure. During lithography, a plurality of pulses of the light beam 110 illuminates the same area of the wafer 120 to constitute an illumination dose.

The photolithography system 100 also preferably includes a control system 135. In general, the control system 135 includes one or more of digital electronic circuitry, computer hardware, firmware, and software. The control system 135 also includes memory which can be read-only memory and/or random access memory. Storage devices suitable for tangibly embodying computer program instructions and data include all forms of non-volatile memory, including, by way of example, semiconductor memory devices, such as EPROM, EEPROM, and flash memory devices; magnetic disks such as internal hard disks and removable disks; magneto-optical disks; and CD-ROM disks.

The control system 135 can also include one or more input devices (such as a keyboard, touch screen, microphone, mouse, hand-held input device, etc.) and one or more output devices (such as a speaker or a monitor). The control system 135 also includes one or more programmable processors, and one or more computer program products tangibly embodied in a machine-readable storage device for execution by one or more programmable processors. The one or more programmable processors can each execute a program of instructions to perform desired functions by operating on input data and generating appropriate output. Generally, the processors receive instructions and data from the memory. Any of the foregoing may be supplemented by, or incorporated in, specially designed ASICs (application-specific integrated circuits). The control system 135 can be centralized or be partially or wholly distributed throughout the photolithography system 100.

Figure 3:
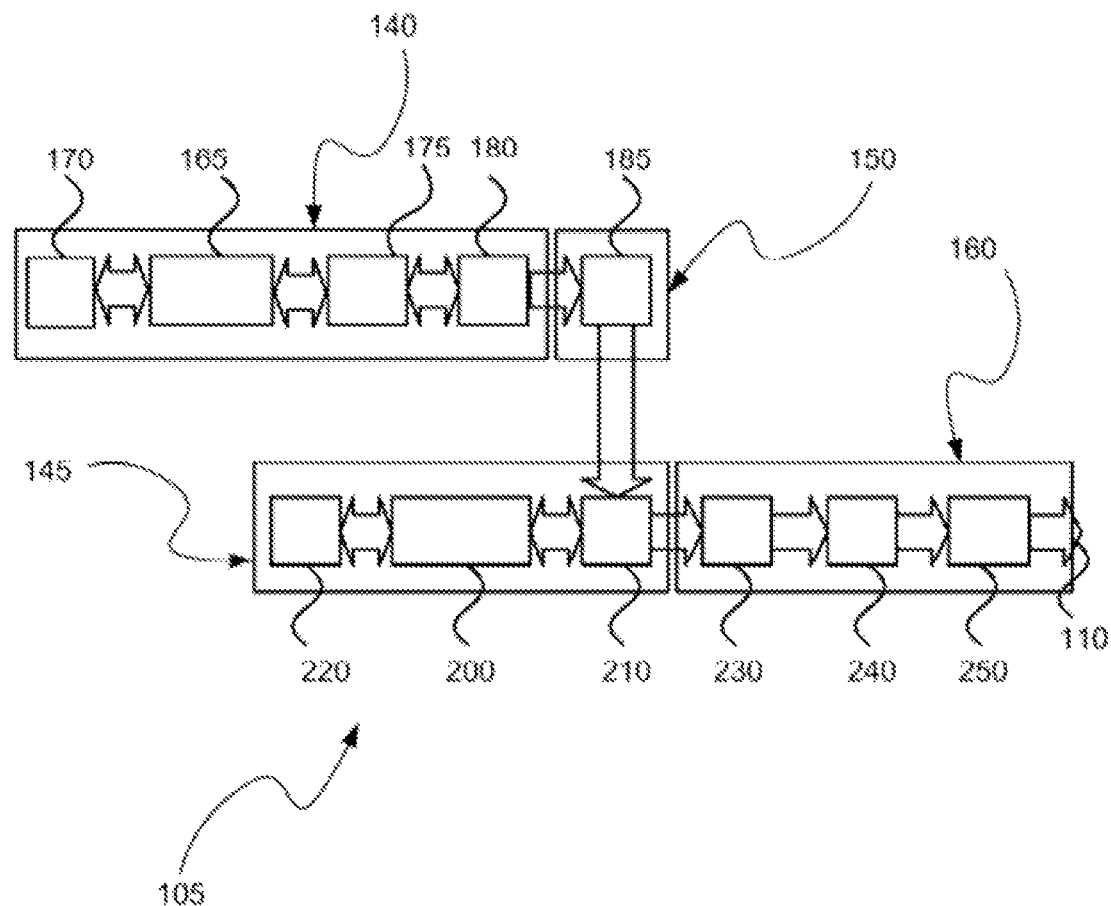
FIG. 3 schematically depicts a view of an overall broad conception of an illumination system according to an aspect of the disclosed subject matter.

Referring to FIG. 3, an exemplary illumination system 105 is a pulsed laser source that produces a pulsed laser beam as the light beam 110. FIG. 3 shows illustratively and in block diagram a gas discharge laser system according to an embodiment of certain aspects of the disclosed subject matter. The gas discharge laser system may include, e.g., a solid state or gas discharge seed laser system 140, an amplification stage, e.g., a power ring amplifier ("PRA") stage 145, relay optics 150 and laser system output subsystem 160. The seed system 140 may include, e.g., a master oscillator ("MO") chamber 165.

The seed laser system 140 may also include a master oscillator output coupler ("MO OC") 175, which may comprise a partially reflective mirror, formed with a reflective grating (not shown) in a line narrowing module ("LNM") 170, an oscillator cavity in which the seed laser 140 oscillates to form the seed laser output pulse, i.e., forming a master oscillator ("MO"). The system may also include a line-centre analysis module ("LAM") 180. The LAM 180 may include an etalon spectrometer for fine wavelength measurement and a coarser resolution grating spectrometer. A MO wavefront engineering box ("WEB") 185 may serve to redirect the output of the MO seed laser system 140 toward the amplification stage 145, and may include, e.g., beam expansion with, e.g., a multi prism beam expander (not shown) and coherence busting, e.g., in the form of an optical delay path (not shown).

The amplification stage 145 may include, e.g., a PRA lasing chamber 200, which may also be an oscillator, e.g., formed by seed beam injection and output coupling optics (not shown) that may be incorporated into a PRA WEB 210 and may be redirected back through the gain medium in the chamber 200 by a beam reverser 220. The PRA WEB 210 may incorporate a partially reflective input/output coupler (not shown) and a maximally reflective mirror for the nominal operating wavelength (e.g., at around 193 nm for an ArF system) and one or more prisms.

A bandwidth analysis module ("BAM") 230 at the output of the amplification stage 145 may receive the output laser light beam of pulses from the amplification stage and pick off a portion of the light beam for metrology purposes, e.g., to measure the output bandwidth and pulse energy. The laser output light beam of pulses then passes through an optical pulse stretcher ("OPuS") 240 and an output combined autoshutter metrology module ("CASMM") 250, which may also be the location of a pulse energy meter. One purpose of the OPuS 240 may be, e.g., to convert a single output laser pulse into a pulse train. Secondary pulses created from the original single output pulse may be delayed with respect to each other. By distributing the original laser pulse energy into a train of secondary pulses, the effective pulse length of the laser can be expanded and at the same time the peak pulse intensity reduced. The OPuS 240 can thus receive the laser beam from the PRA WEB 210 via the BAM 230 and direct the output of the OPuS 240 to the CASMM 250. Other suitable arrangements may be used in other embodiments.

The PRA lasing chamber 200 and the MO 165 are configured as chambers in which electrical discharges between electrodes may cause lasing gas discharges in a lasing gas to create an inverted population of high energy molecules, including, e.g., Ar, Kr, and/or Xe, to produce relatively broad band radiation that may be line narrowed to a relatively very narrow bandwidth and centre wavelength selected in a line narrowing module ("LNM") 170, as is known in the art.

Typically the tuning takes place in the LNM. A typical technique used for line narrowing and tuning of lasers is to provide a window at the back of the laser's discharge cavity through which a portion of the laser beam passes into the LNM. There, the portion of the beam is expanded with a prism beam expander and directed to an optical element, such as a grating which reflects a narrow selected portion of the laser's broader spectrum back into the discharge chamber where it is amplified. The laser is typically tuned by changing the angle at which the beam illuminates the grating using an actuator such as, for example, a piezoelectric actuator. Alternatively a transmissive optical element, such as a prism may be used to transmit a narrow selected portion of the laser's broader spectrum back into the discharge chamber where it is amplified. The laser may be tuned by changing the angle at which the beam illuminates the prism using an actuator such as, for example, a piezoelectric actuator.

As set forth above, for some applications it is beneficial to be able to generate a burst of one or more pulses having one wavelength and then be able to switch to generating a burst of one or more pulses having a different wavelength. Switching wavelengths between pulses, however, is challenging. One reason is that the settling time, that is, the amount of time it takes the system to stabilize after a wavelength change, is typically longer than the interpulse interval. According to one aspect, the transient settling period caused by changing the reference wavelength is shortened by preparing the actuator by pre-positioning the actuator between bursts to achieve an upcoming new target wavelength between bursts.

According to another aspect, a dynamic model of the actuator is used to compute an optimal control waveform for actuating the actuator to minimize the difference between actual wavelength and wavelength targets.

The optimal control waveform can be computed using any one of several methods. For example, the optimal control waveform may be computed using dynamic programming. This method is well adapted for dealing with complex models that contain nonlinear dynamics. If an actuator model is adopted that has strong nonlinear dynamics, then dynamic programming may be used to generate the optimal control signal for given wavelength targets. Dynamic programming does, however, present the challenge that it requires significant computational resources which may not be implementable in real-time. To overcome this challenge a data storage device such as a pre-populated look-up-table or a pre-programmed field programmable gate array (FPGA) may be used which contains optimal control parameters for at least some of the different repetition rates at which the source may be operated.

As another example, the optimal control waveform may be determined using model inversion feedforward control. This method relies on the actuator dynamic model to construct a digital filter that inverts the actuator dynamic. By passing the desired waveform for the desired actuator trajectory through this filter, an optimal control waveform can be generated in real time to achieve zero steady state error tracking.

As another example, an optimal solution to achieve two separate wavelengths in a stable manner is accomplished using a learning algorithm to guarantee error convergence over several iterations of learning.

Embodiments of the systems and methods disclosed herein can potentially achieve two separate wavelengths separated by 1000 fm with a separation error below 20 fm.

According to another aspect, the optimal control waveform may be fed to the actuator at a very high rate by using a FPGA.

Figure 4:
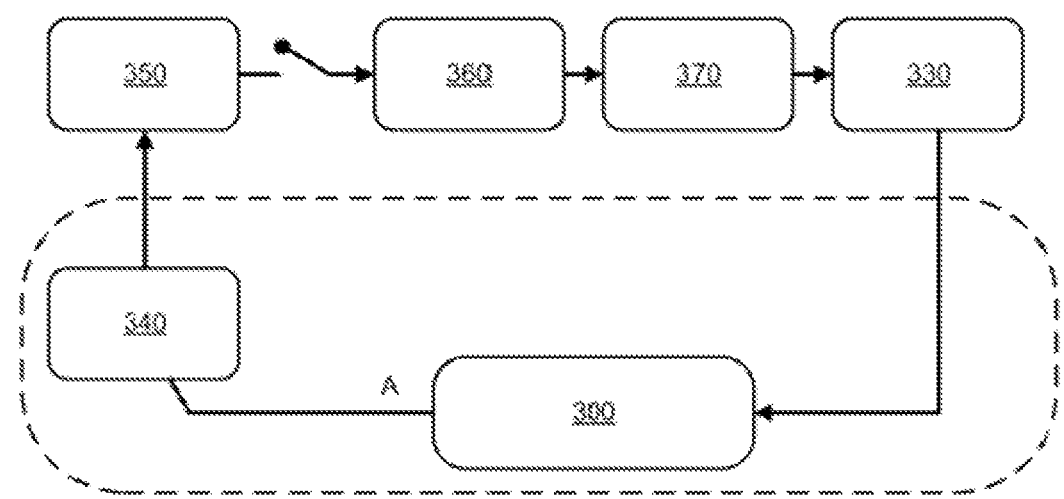
FIG. 4 shows a functional block diagram of a two chamber laser system according to an aspect of an embodiment.

The control system may include a combination of feed-forward control and iterative learning control (ILC). As shown in FIG. 4, a feed-forward control signal A is computed offline by ILC module 300 using a wavelength measurement from streaming data acquisition unit 330 and an ILC update law as will be described below. A bandwidth wavelength control module (BWCM) 340 uses the feed-forward control signal A to update pre-defined data in a data storage unit such as an FPGA included in the BWCM 340. The BWCM 340 then actuates a piezoelectric transducer PZT 350 at, for example, 60 kHz when the laser is pulsing. The wavelength of the laser radiation is measured by a line centre (centre wavelength) analysis module (LAM) 360 and fire control platform or processor (FCP) 370, and the wavelength measurement is provided to data acquisition unit 330 at 6 kHz.

It will be appreciated that the system shown in FIG. 4 may be configured to encompass multiple frequency regimes. The area inside the broken box denotes processes that may occur essentially offline. The PZT 350 may be driven with control signals updated at a rate of at about 60 kHz. Wavelength data may be acquired at about 6 kHz.

In order to account for constraints on the change of PZT voltage, quadratic programming with constraints may be used to help find the optimal feed-forward signal within the feasible region of operation. Quadratic programming (QP) is a technique for solving various mathematical optimization problems. QP may be used to mathematically find an optimal solution to a given quadratic cost function with constraints. In the context of the present disclosure, QP may be used to find an optimal control waveform that could be used to actuate a piezoelectric transducer in order to provide laser wavelengths at desired target values. The optimization can be based on a model of the PZT dynamic response (e.g., mechanical response to an electrical input). In various implementations of an optimization technique, a QP-generated waveform may be used as an optimized control waveform for driving a PZT in open-loop (represented by "U" below). In various implementations, for example, where a laser system experiences various disturbances during operation, feedback control based on laser wavelength measurement may be helpful to ensure stability. One possible disturbance source, which is discussed below, is "repetition rate deviation," in which the commanded repetition rate of a pulsed laser deviates from an anticipated reference rate.

The standard QP solver can solve a problem with the following structure:

$$\min_X \left(\frac{1}{2} X^T H X + f^T X\right) \quad \text{(Equation 1)}$$

$$\text{s.t. } LX \leq b$$

where X is the design parameter that can be freely chosen except that it has to satisfy LX≤b. In other words, the QP solver finds the optimal X that minimizes the cost function within a feasible region defined by LX≤b. Equation 1 shows the standard formulation of a Quadratic Programming problem. The inventors have discovered that this form can be utilized for identifying useful optimized control waveforms, designated as "u" or "U" below. The following discussion outlines a presentation of the problem in standard QP form. In the following discussion, "P" is a representation of PZT dynamic shown in equation 2; and "H" is a quadratic of "P" with weighting "Q". Thus "H" essentially carries the PZT dynamics in the QP form.

In the techniques being described here, the objective is to find the feed-forward control that satisfies the actuator constraints while minimizing the error between actuator position and the desired control waveform. The PZT dynamic can be expressed in the following state-space form:

$$x(k+1) = Ax(k) + Bu(k)$$

$$y(k+1) = Cx(k+1) \quad \text{(Equation 2)}$$

where A, B, C are the state, input, and output matrices, respectively, that describe the PZT dynamics; x is the state vector, u is the input vector, and y is the output from PZT.

Substituting the above dynamic model, the original cost function can be rewritten as $$\min_U \left(\frac{1}{2} U^T P^T Q P U - R^T Q P U\right) \quad \text{(Equation 3)}$$

$$\text{s.t. } DU \leq l$$

This fits into the standard QP form where $$H = P^T Q P$$

$$f = -P^T Q R$$

$$X = U$$

$$L = D$$

$$b = l \quad \text{(Equation 4)}$$

and P describes the PZT input-output dynamics, Q is the weighting function, R denotes the desired control waveform, D represents the actuator constraints, and l is the threshold on the actuator constraints.

According to another aspect, ILC control can be described by the following equations:

$$U_k = U_{k-1} + LE_{k-1} \quad \text{(Equation 5)}$$

where Uk is the feedforward control signal used at kth iteration, L is the learning function that dictates the convergence of the ILC algorithm, and Ek is the error at kth iteration.

The stability and convergence property of the ILC control can be derived by combining the ILC control law with the dynamic model of the system as $$E_k = (1 - PL)E_{k-1} \quad \text{(Equation 6)}$$

where P is the matrix that describes the input-output relation of the system, and I is the identity matrix. Stability is guaranteed if the absolute value of all the eigenvalues of (I-PL) is smaller than 1. The convergence rate is also determined by the matrix (I-PL). If (I-PL)=0 then the error would converge to 0 after one iteration.

Figure 5:
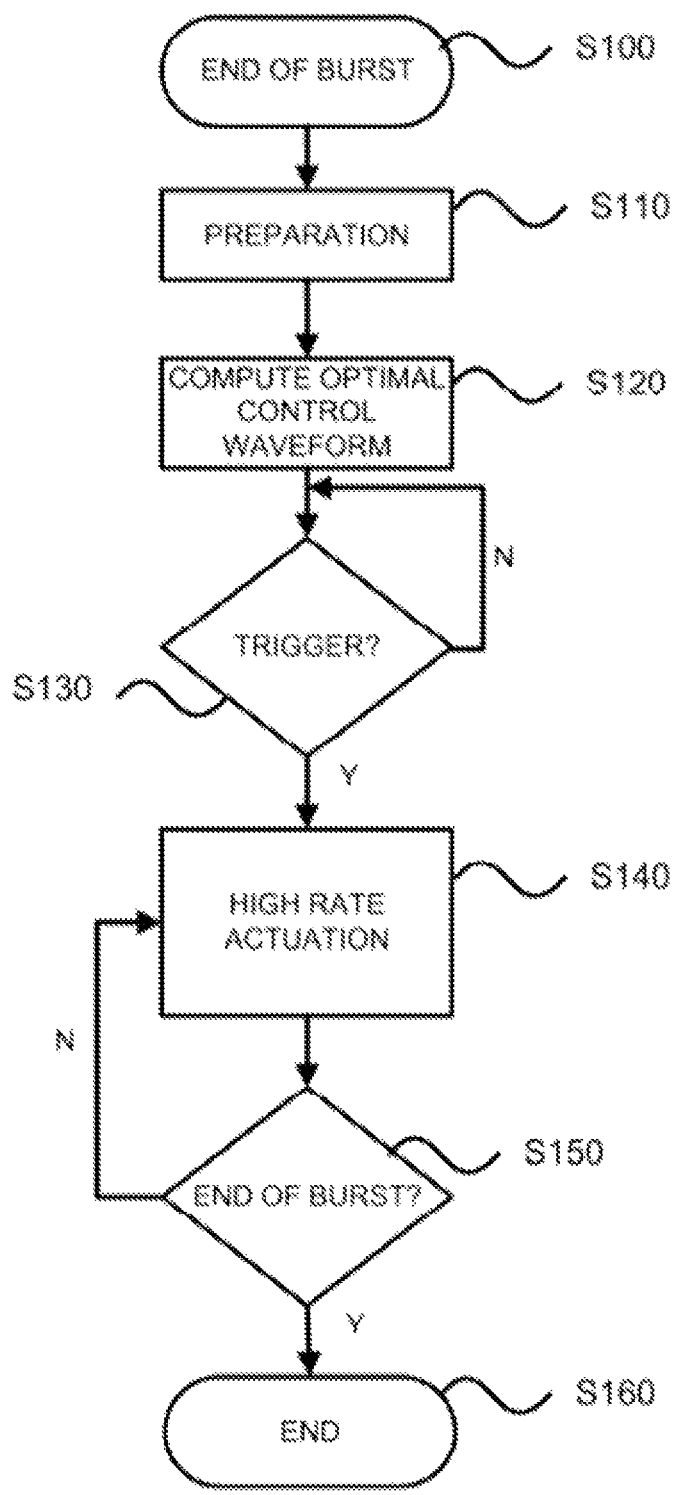
FIG. 5 is a flow chart showing a possible relative timing of discharges in two laser chambers according to an aspect of an embodiment.

FIG. 5 is a flowchart showing a method of controlling a radiation source according to one aspect of an embodiment. In a step S100 a prior burst of pulses has ended. In step S110 the actuator is prepared by pre-positioning it to a position which is between the position it should be in to produce pulses having a first frequency and the position it should be to produce pulses having second frequency. In a step S120 an optimal control waveform is computed using one or more of the techniques described above. In a step S130 it is determined whether a new burst has been triggered. If a new burst has not been triggered, then step S130 is repeated. If a new burst has been triggered, then in a step S140 the parameters for operation at a commanded repetition rate and frequency are relayed to the source using, for example, an FPGA. In step S150 it is determined whether the current burst has ended. If the current burst has not ended, then step S140 is repeated. If the burst has ended, then the process ends at step S160.

Figure 6:
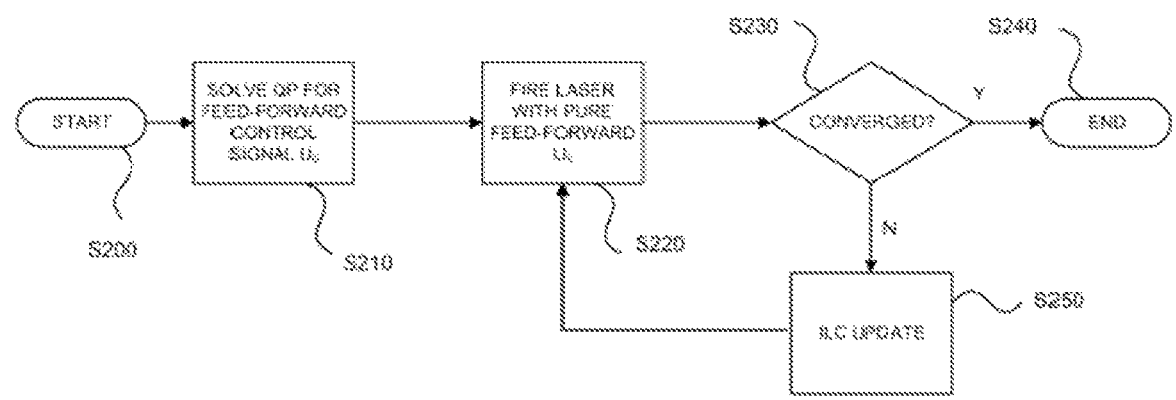
FIG. 6 is a flow chart showing another possible relative timing of discharges in two laser chambers according to an aspect of an embodiment.

FIG. 6 shows a method performed by the ILC for computing its update law with an initial QP feedforward control signal. In a step S210 quadratic programming is used to develop an initial feedforward control signal. In a step S220 the feedforward control signal as used to fire the laser. In a step S230, it is determined whether the error in the feedforward signal has converged. If the error has not converged, then in step S250 iterative learning is used to update the control signal. The new control signal is then used to fire the laser in step S220. If the error has converged then the process ends as in step S240.

The method of switching between different wavelengths of radiation in order to bring the radiation into focus at different depths in the resist of the substrate may be referred to as multi-focal imaging. The methods of generating the control signal that is used during multi-focal imaging may assume that a pulse repetition rate of the radiation system is fixed at a reference pulse repetition rate. The reference pulse repetition rate may, for example, be about 6000 Hz. An operational pulse repetition rate of the radiation system (i.e. a commanded pulse repetition rate) may differ from the reference pulse repetition rate. The difference between the reference pulse repetition rate and the operational pulse repetition rate may be intentional and/or unintentional. For example, a lithographic apparatus may receive many different variables under many different constraints (e.g. scan speed of the substrate) and process this information to determine how best to provide a desired dose of radiation to a target portion of the substrate. In some cases, a controller or processor of the lithographic apparatus may determine that a preferred way to provide a desired dose of radiation to a target portion of the substrate is to vary the operational pulse repetition rate of the light source such that the target portion of the substrate receives a larger or smaller dose of radiation during the scan. For example, during operation of the lithographic apparatus the operational pulse repetition rate may be equal to the reference pulse repetition rate±about 5 Hz. The inventors have found that the difference between the operational pulse repetition rate and the reference pulse repetition rate may lead to errors such as wavelength errors. That is, the light source may generate pulses of radiation having inaccurate wavelengths, which may result in the radiation being brought into focus at incorrect depths within the resist of the substrate. This in turn can lead to faulty devices being formed by the lithographic apparatus.

Figure 7:
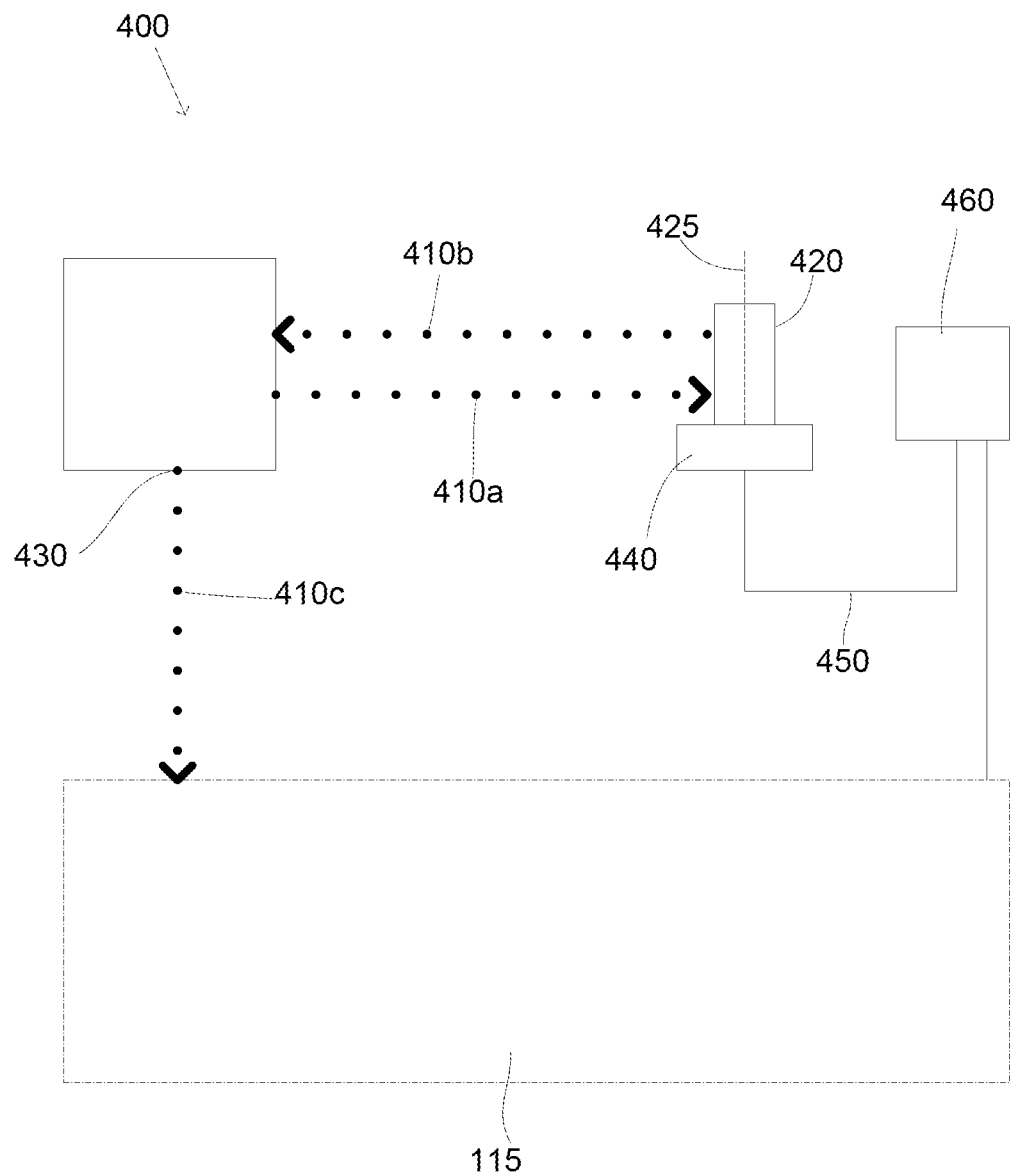
FIG. 7 schematically depicts a radiation system for controlling pulses of radiation according to an embodiment.

In order to better understand how a difference between the operational pulse repetition rate and the reference pulse repetition rate of a radiation system may lead to wavelength errors, it is first useful to understand how the components of the radiation system interact with one another. FIG. 7 schematically depicts an example of a radiation system 400 for controlling pulses of radiation 410a-c. The radiation system 400 comprises an optical element 420 configured to interact with pulses of radiation 410a to control a characteristic of the pulses of radiation 410b-c. In the example of FIG. 7, the optical element 420 comprises a grating. The grating 420 is configured to reflect incident pulses of radiation 410a in a wavelength dependent manner such that a selected band of wavelengths of radiation are transmitted to an output 430 of the radiation system 400. The selected band of wavelengths that are transmitted to the output 430 of the radiation system 400 may depend upon an angle of incidence of the pulses of radiation 410a with respect to the grating 420. The optical element 420 may alternatively comprise a prism configured to refract the pulses of radiation 410a in a wavelength dependent manner such that a selected band of wavelengths of radiation are transmitted to the output 430 of the radiation system 400. The selected band of wavelengths that are transmitted to the output 430 of the radiation system 400 may depend upon an angle of incidence of the pulses of radiation 410a with respect to the prism.

The radiation system 400 further comprises an actuator 440 configured to actuate the optical element 420 according to a control signal 450 received from a controller 460. The actuator 440 may comprise a piezoelectric element configured to rotate the optical element 420 about an axis of rotation 425 such that an angle of incidence of the pulses of radiation 410a on the optical element 420 changes. The selected band of wavelengths of radiation that are transmitted to the output 430 of the radiation system 400 by the optical element 420 depend upon an angle of incidence of the pulses of radiation with respect to the optical element 420. Thus, the optical element 420 must be in the correct rotational position when each pulse of radiation 410a arrives and interacts with the optical element 420 such that the correct band of wavelengths of radiation are transmitted to the output of the radiation system 400.

The control signal 450 may at least partially depend on a reference pulse repetition rate of the radiation system 400. The output 430 of the radiation system 400 may, for example, direct the controlled pulses of radiation 410c to a lithographic apparatus or scanner 115 for use in a lithographic exposure. The controlled pulses of radiation 410c may be patterned by the lithographic apparatus 115 and projected onto a target, such as a target portion C of a substrate W as shown in FIG. 1.

In order for the optical element 420 to select the desired band of wavelengths of radiation from the pulses of radiation 410a that are incident upon the optical element 420, the optical element 420 must be in the correct position relative to the pulses of radiation 410a when the pulses of radiation 410a interact with the optical element 420. That is, the time at which the pulses of radiation 410a interact with the optical element 420 must be correctly synchronised with the motion of the optical element 420 such that the desired band of wavelengths of radiation is selected by the optical element 420. The control signal 450 used to control the actuator 440 and thereby control the rotational position of the optical element 420 may, for example, have a generally sinusoidal form causing the optical element 420 to oscillate between two rotational positions. The frequency of this oscillation is at least partly determined by the repetition rate of the pulses of radiation 410a. The radiation system 400 may be designed such that each pulse of radiation 410a should arrive at the optical element 420 when the sinusoidal control signal 450 is at a peak and/or a trough to ensure that the correct band of wavelengths of radiation is selected by the optical element 420.

Figure 8:
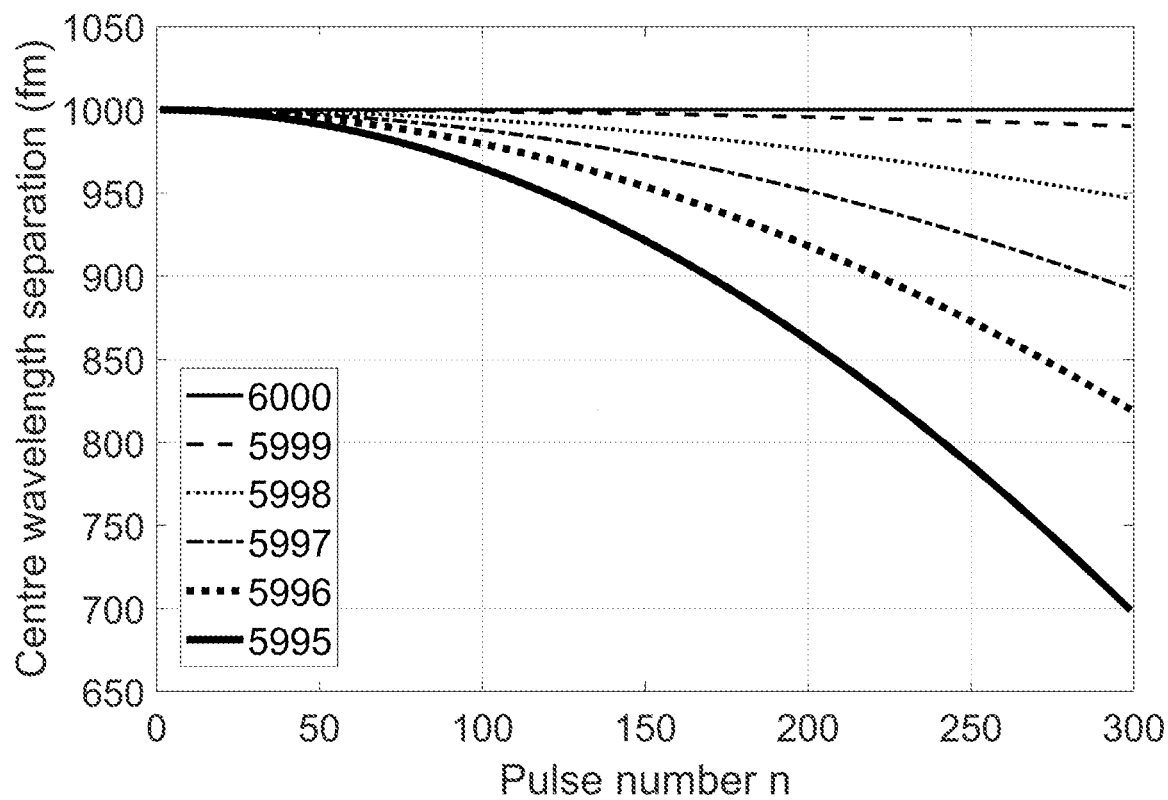
FIG. 8 is a graph showing how differences between the reference pulse repetition rate and the operational pulse repetition rate of the radiation system can affect an accuracy of the wavelength of radiation controlled by the radiation system.

FIG. 8 is a graph showing how differences between the reference pulse repetition rate and the operational pulse repetition rate of the radiation system can affect an accuracy of the wavelength of radiation controlled by the radiation system. If a difference exists between the operational pulse repetition rate and the reference pulse repetition rate then the motion of the optical element 420 is no longer correctly synchronised with the arrival times of the pulses of radiation 410a. This means that when the pulses of radiation 410a arrive at the optical element 420, the optical element 420 is not in the correct angular position. The angle of incidence between the optical element 420 and the pulse of radiation 410a is therefore incorrect when the pulse interacts with the optical element 420 such that the wavelength of radiation selected by the optical element 420 is incorrect. The motion of the optical element 420 falls further out of sync with the arrival time of the pulses of radiation 410a throughout a burst (i.e. a group) of pulses of radiation 410a, thereby making the problem worse as the burst continues. This effect can be seen in FIG. 8.

In the example of FIG. 8, the reference pulse repetition rate of the radiation system is 6000 Hz. The x-axis of the graph shows the pulse number within a burst of 300 pulses of radiation. The y-axis of the graph shows the separation between two desired centre wavelengths of radiation. In the example of FIG. 8, the radiation system is attempting to switch between two wavelengths of radiation that are separated by 1000 fm. The graph shows the wavelength error associated with six different operational repetition rates (6000 Hz, 5999 Hz, 5998 Hz, 5997 HZ, 5996 Hz and 5995 Hz) as a burst of 300 pulses of radiation progresses. When the operational pulse repetition rate is 6000 Hz when the reference repetition rate and the operational pulse repetition rate are equal) the centre wavelength separation stays at the desired 1000 fm throughout the entirety of the burst, meaning that no wavelength error has occurred. When the operational pulse repetition rate differs from 6000 Hz (i.e. when the reference repetition rate and the operational pulse repetition rate are not equal) the centre wavelength separation deviates from the desired 1000 fm. This deviation increases throughout the entirety of the burst, resulting in a significant wavelength error. As shown by FIG. 8, the greater the difference between the operational pulse repetition rate and the reference pulse repetition rate, the greater the resulting wavelength error. For example, when the operational pulse repetition rate is 5998 Hz (i.e. a difference of 2 Hz) the wavelength error of the final pulse is about 50 fm. When the operational pulse repetition rate is 5995 Hz (i.e. a difference of 5 Hz) the wavelength error of the final pulse is about 300 fm. Thus, even relatively small deviations in the operational pulse repetition rate can induce a phase error between the actuator's dynamical response and the control signal, which may result in a significant wavelength error which worsens throughout the burst.

In various implementations of a control technique, errors associated with operational pulse repetition rate deviation may be reduced by adjusting the control signal of the actuator to at least partially account for the deviation. Referring again to FIG. 7, the lithographic apparatus 115 may communicate with the controller 460. For example, the controller 460 may receive pulse information such as pulse number and operational repetition rate from the lithographic apparatus 115 and use the pulse information to determine an adjustment to the control signal. Given that the deviation in repetition rate results in a phase difference between the control signal and the arrival time of the pulses of radiation, one way to compensate for phase difference is to adjust the phase of the control signal such that the control signal is always in-phase with the arrival times of the radiation pulses. However, the actuator tends to be underdamped because it oscillates at such a high frequency (e.g. about 60 kHz). Thus, changing the phase of the control signal for an underdamped actuator is likely to introduce significant transient oscillation that introduces errors of its own. A preferable alternative is to adjust the magnitude of the control signal to at least partially account for the phase difference between the motion of the optical element and the arrival times of the pulses that is induced by repetition rate deviation.

The wavelength error caused by repetition rate deviation at the nth pulse of a burst can be described by the following formula:

$$\lambda_A(n) = \lambda_T(n) - |P(f)| \times |U(f)| \times \cos(2\pi \times f \times \Delta \times n) \quad \text{(Equation 7)}$$

where $\lambda_T$ is the target wavelength of the pulses of radiation 410c, n is the pulse number, P(f) is the dynamic model of the actuator 440 in the frequency domain, U(f) is the control signal 450 of the actuator 440 in the frequency domain, f represents a frequency of interest and $\Delta$ is the difference between the operational pulse repetition rate and the reference pulse repetition rate (i.e. the repetition rate deviation). Thus, |P(f)| is the magnitude of the dynamic model of the actuator 440 at frequency f and |U(f)| is the magnitude of the control signal 450 of the actuator 440 at frequency f. As discussed above, the control signal may be determined using one of several methods, e.g. dynamic programming, model inversion feedforward control, and/or a learning algorithm to guarantee error convergence over several iterations of learning.

The frequency of interest may depend upon the reference pulse repetition rate of the radiation system 400 because the control signal 450 at least partially depends upon the reference pulse repetition rate of the radiation system 400. For example, the control signal 450 may be configured to cause the actuator 440 to actuate the optical element 420 at a frequency of about half of the reference pulse repetition rate. To achieve this, the control signal 450 may have most of its energy at about half of the reference pulse repetition rate. Thus, the frequency of interest may be about half of the reference pulse repetition rate. For example, if the reference pulse repetition rate is about 6000 Hz, then the frequency of interest would be about 3000 Hz. When the radiation system 400 is in a multifocal imaging mode that involves switching the wavelength of consecutive pulses of radiation 410a between two target center wavelengths, the wavelength error at the nth pulse may be described by the following equation:

$$\lambda_\Delta(n) = \lambda_T(n) - \left|P\left(\frac{R_r}{2}\right)\right| \times \left|U\left(\frac{R_r}{2}\right)\right| \times \cos\left(2\pi \times \frac{R_r}{2} \times \Delta \times n\right) \quad \text{(Equation 8)}$$

where $R_r$ is the reference pulse repetition rate of the radiation system 400. In this case, $$\left|P\left(\frac{R_r}{2}\right)\right|$$

is the magnitude of the dynamic model of the actuator 440 at a frequency of $$\frac{R_r}{2} \text{ Hz}$$

and $$\left|U\left(\frac{R_r}{2}\right)\right|$$

is the magnitude of the control signal 450 of the actuator 440 at a frequency of $$\frac{R_r}{2} \text{ Hz.}$$

The multiplication of these two terms $$\left(\text{i.e. } \left|P\left(\frac{R_r}{2}\right)\right| \times \left|U\left(\frac{R_r}{2}\right)\right|\right)$$

represents the actuator output when the control signal contains energy at a frequency of $$\frac{R_r}{2} \text{ Hz}$$

(i.e. the frequency of interest). That is, because the control signal 450 has most of its energy at a frequency of $$\frac{R_r}{2} \text{ Hz,}$$

an output of the actuator can be predicted by using the actuator dynamic response model at a frequency of $$\frac{R_r}{2} \text{ Hz.}$$

When there is no difference between the operational pulse repetition rate and the reference pulse repetition rate (i.e. when $\Delta=0$), Equation 8 can be rewritten as:

$$\lambda_\Delta(n) = \lambda_T(n) - \left|P\left(\frac{R_r}{2}\right)\right| \times \left|U\left(\frac{R_r}{2}\right)\right| \quad \text{(Equation 9)}$$

In order to ensure that the wavelength error of the pulses of radiation 410c is zero (i.e. $\lambda_\Delta(n)=0$) the magnitude of the control signal 450 can be set to abide by the following equation:

$$\left|U\left(\frac{R_r}{2}\right)\right| = \frac{\lambda_T(n)}{\left|P\left(\frac{R_r}{2}\right)\right|} \quad \text{(Equation 10)}$$

When there is a difference between the operational pulse repetition rate and the reference pulse repetition rate (i.e. when $\Delta \neq 0$) and the magnitude of the control signal 450 is set to Equation 10

$$\left(\text{i.e. when } \left|U\left(\frac{R_r}{2}\right)\right| = \frac{\lambda_T(n)}{\left|P\left(\frac{R_r}{2}\right)\right|}\right)$$

then the wavelength error of the pulses of radiation 410c (i.e. Equation 8) can be described by the following equation:

$$\lambda_\Delta(n) = \lambda_T(n) \times \left(1 - \cos\left(2\pi \times \frac{R_r}{2} \times \Delta \times n\right)\right) \quad \text{(Equation 11)}$$

An adjustment may be made to the control signal 450 to reduce the wavelength error of the pulses of radiation 410c. The adjustment may take the form of a correction factor that can be applied to the control signal 450 to create an adjusted control signal. The adjusted control signal may take the form:

$$\left|U\left(\frac{R_r}{2}\right)\right|_A = \frac{\lambda_T(n)}{\left|P\left(\frac{R_r}{z}\right)\right|} \times C \quad \text{(Equation 12)}$$

where C is the correction factor.

The adjusted control signal may be substituted into Equation 8, and Equation 8 may be set to equal zero such that the wavelength error of the pulses of radiation is zero, as shown by the following equation:

$$\lambda_\Delta(n) = \lambda_T(n) - \left|P\left(\frac{R_r}{2}\right)\right| \times \frac{\lambda_T(n)}{\left|P\left(\frac{R_r}{2}\right)\right|} \times C \times \cos\left(2\pi \times \frac{R_r}{2} \times \Delta \times n\right) = 0 \quad \text{(Equation 13)}$$

Equation 13 may be rearranged to the following equation:

$$\left|P\left(\frac{R_r}{2}\right)\right| \times \frac{\lambda_T(n)}{\left|P\left(\frac{R_r}{2}\right)\right|} \times C \times \cos\left(2\pi \times \frac{R_r}{2} \times \Delta \times n\right) = \lambda_T(n) \quad \text{(Equation 14)}$$

Equation 14 can be rearranged to define the correction factor. That is, the correction factor may take the following form:

$$C = \frac{1}{\cos(2\pi \times R_r \times \Delta \times n)} \quad \text{(Equation 15)}$$

That is, the correction factor may be a function of the reference pulse repetition rate, the difference between the reference pulse repetition rate and the operational pulse repetition rate and the pulse number. Thus, once the number of pulses is greater than one (i.e. n>1), the correction factor may be calculated for each subsequent pulse of radiation.

Figure 9:
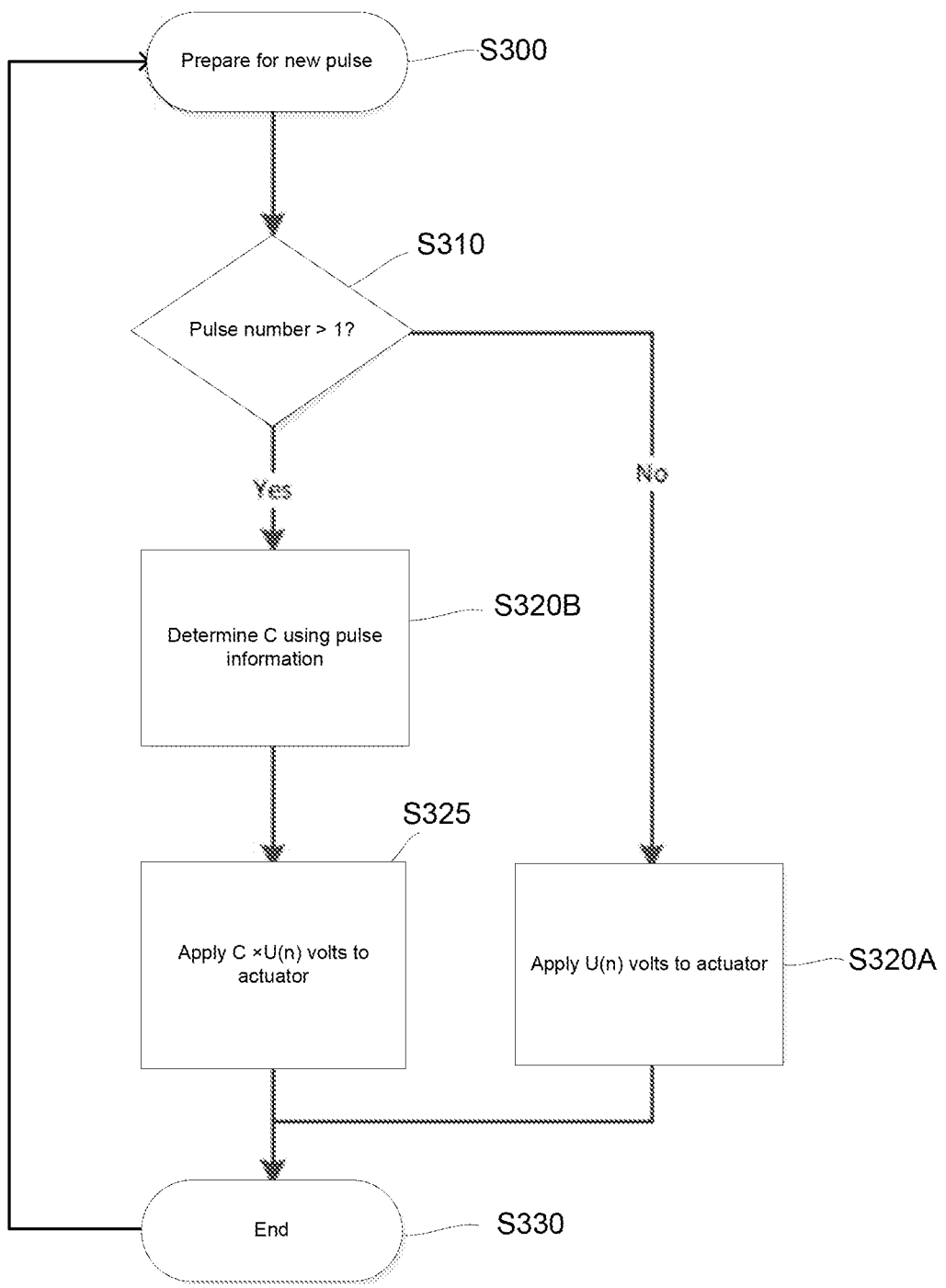
FIG. 9 is a flow chart showing a method of controlling pulses of radiation according to an embodiment: and, FIG. 10 shows the results of a simulation comparing a radiation system without an adjusted control signal to a radiation system having an adjusted control signal according to an embodiment.

FIG. 9 shows a method of controlling pulses of radiation according to an embodiment. Step S300 comprises preparing for a new pulse or burst of pulses of radiation. This may involve, for example, moving the actuating the optical element into a desired position or oscillation. Step S310 comprises a decision in which it is determined whether or not the pulse number is greater than one. This step takes place because the operational pulse repetition rate can only be determined after the pulse number is greater than one. For example, the operational pulse repetition rate may be determined by taking the reciprocal of the interval between two consecutive pulses, and thus the operational pulse repetition rate can only be computed for the second pulse at the earliest. If the pulse number is not greater than one then the method progresses to Step 320A which comprises applying the unadjusted control signal to the actuator. If the pulse number is greater than one then the method progresses to Step S320B which comprises determining the correction factor using the operational repetition rate and the pulse number as set out in Equation 15. The method then progresses to Step S325 which comprises applying the correction factor to the control signal in order to adjust a magnitude of the control signal. The adjusted control signal is applied to the actuator in order to at least partially compensate for the repetition rate deviation and thereby reduce a wavelength error of the radiation system.

Figure 10:
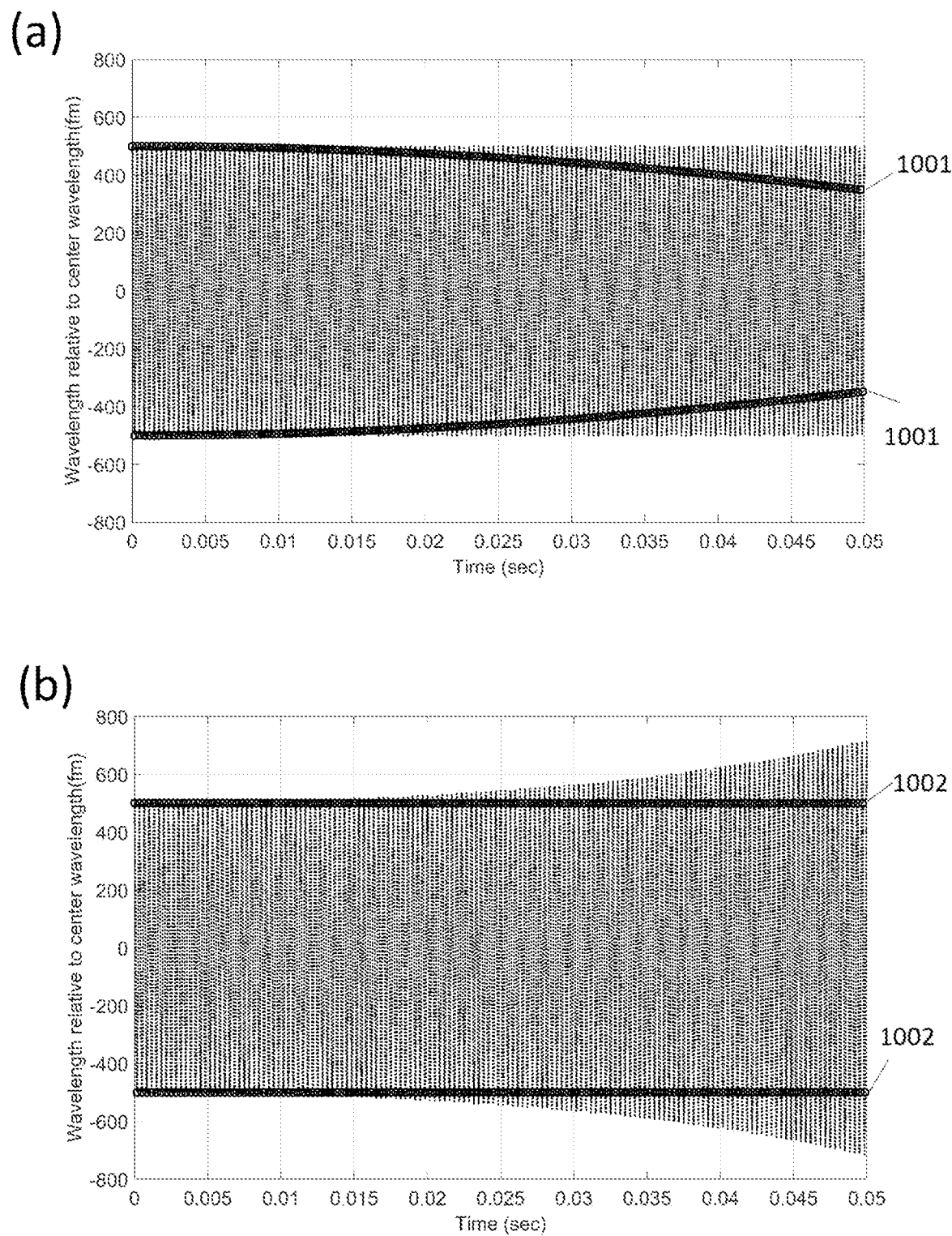

FIG. 10 shows simulated results comparing the wavelength stability for a modelled radiation system without an adjusted control signal (in panel (a)) against a modelled radiation system with an adjusted control signal (in panel (b)). In the example of FIG. 10, the radiation systems are attempting to switch between two wavelengths of radiation that are separated by 1000 fm.

The dashed lines in FIG. 10 represent the trajectories of the PZTs in each of the systems. Large dots 1001, 1002 on the trajectories mark the times on the when laser pulses arrive; the large dots appear as thick lines due to overlap between adjacent dots. In the case where repetition rate deviation is present (i.e., the actual commanded repetition rate is different from the reference repetition rate), the laser pulses' arrival times are not synchronous with the PZT trajectory. In panel (a), this lack of synchrony results in a wavelength error that grows over time: the dots 1001 do not consistently hit their target at times that results in +/−500 fm tuning. In panel (b), the repetition rate deviation is compensated by appropriately increasing the magnitude of the PZT trajectory. The appropriate adjustment to the input signal may be determined using the techniques discussed above. The result is that the dots 1002 more consistently hit their target at times that results in the desired +/−500 fm tuning.

As can be seen from FIG. 10 the radiation system (panel (a)) that does not determine and apply an adjusted control signal suffers from an increasing wavelength error with increasing time through a burst of pulses of radiation. After 0.05 seconds the radiation system 500 that does not use an adjusted control signal suffers from a wavelength error of more than about 200 fm. In contrast, the radiation system (panel(b)) that determines and applies an adjusted control signal to the actuator maintains the desired wavelength separation of about 1000 fm throughout the burst of pulses of radiation.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

Other aspects of the invention are set out in the following numbered clauses.

1. A radiation system for controlling pulses of radiation comprising:
an optical element configured to interact with the pulses of radiation to control a characteristic of the pulses of radiation;
an actuator configured to actuate the optical element according to a control signal received from a controller, the control signal at least partially depending on a reference pulse repetition rate of the radiation system, wherein the controller is configured to receive pulse information and use the pulse information to determine and apply an adjustment to the control signal.

2. The radiation system of clause 1, wherein the characteristic is a wavelength of the pulses of radiation.

3. The radiation system of clause 1, wherein the pulse information includes an operational pulse repetition rate of the radiation system and wherein the adjustment at least partially accounts for a difference between the reference pulse repetition rate and the operational pulse repetition rate.

4. The radiation system of clause 1, wherein the adjustment changes a magnitude of the control signal.

5. The radiation system of clause 4, wherein the magnitude of the control signal is:

$$|U(f)| = \frac{\lambda_T(n)}{|P(f)|}$$

where U (f) is the control signal of the actuator in the frequency domain, $\lambda_T$ is a target wavelength of the pulses of radiation, n is the pulse number and P(f) is a dynamic model of the actuator in the frequency domain.

6. The radiation system of clause 5, wherein the pulse information includes a pulse number and wherein the changed magnitude of the control signal is:

$$|U(f)|_A = \frac{\lambda_T(n)}{|P(f)|} \times C$$

where C is a correction factor.

7. The radiation system of clause 6, wherein the correction factor is:

$$C = \frac{1}{\cos(2\pi \times R_r \times \Delta \times n)}$$

where $R_r$ is the reference pulse repetition rate of the radiation system and $\Delta$ is a difference between the operational pulse repetition rate and the reference pulse repetition rate.

8. The radiation system of clause 7, wherein the correction factor is calculated and applied to the control signal for each pulse of radiation generated by the radiation system.

9. The radiation system of clause 1, wherein the actuator comprises a piezoelectric element configured to rotate the optical element such that an angle of incidence of the pulses of radiation on the optical element changes.

10. The radiation system of clause 1, wherein the optical element comprises a grating configured to reflect the pulses of radiation in a wavelength dependent manner such that a selected band of wavelengths of radiation are transmitted to an output of the radiation system.

11. The radiation system of clause 1, wherein the optical element comprises a prism configured to refract the pulses of radiation in a wavelength dependent manner such that a selected band of wavelengths of radiation are transmitted to the output of the radiation system.

12. A lithographic system comprising:
a lithographic apparatus configured to receive pulses of radiation, pattern the pulses of radiation and project the patterned pulses of radiation onto a target; and, a radiation system according to clause 1.

13. A method of controlling pulses of radiation comprising:
using an optical element to interact with the pulses of radiation to control a characteristic of the pulses of radiation;
using an actuator to actuate the optical element according to a control signal that at least partially depends on a reference pulse repetition rate of the radiation system;
receiving pulse information; and,
using the pulse information to determine and apply an adjustment to the control signal.

14. The method of clause 13, wherein the characteristic is a wavelength of the pulses of radiation.

15. The method of clause 14, wherein the pulse information includes an operational pulse repetition rate of the radiation system and wherein the adjustment at least partially accounts for a difference between the reference pulse repetition rate and the operational pulse repetition rate.

16. The method of clause 14, wherein the adjustment changes a magnitude of the control signal.

17. The method of clause 16, wherein the magnitude of the control signal is:

$$|U(f)| = \frac{\lambda_T(n)}{|P(f)|}$$

where U(f) is the control signal of the actuator, $\lambda_T$ is a target wavelength of the pulses of radiation, n is the pulse number and P(f) is a dynamic model of the actuator.

18. The method of clause 17, wherein the pulse information includes a pulse number and wherein the changed magnitude of the control signal is:

$$|U(f)|_A = \frac{\lambda_T(n)}{|P(f)|} \times C$$

where C is a correction factor.

19. The method of clause 18, wherein the correction factor is:

$$C = \frac{1}{\cos(2\pi \times R_r \times \Delta \times n)}$$

where $R_r$ is the reference pulse repetition rate of the radiation system and $\Delta$ is a difference between the operational pulse repetition rate and the reference pulse repetition rate.

20. The method of clause 19, wherein the correction factor is calculated and applied to the control signal for each pulse of radiation generated by the radiation system.

21. A method of projecting a patterned beam of radiation onto a target, wherein the patterned beam of radiation comprises pulses of radiation, the method further comprising controlling the pulses of radiation according a method comprising:
using an optical element to interact with the pulses of radiation to control a characteristic of the pulses of radiation;

using an actuator to actuate the optical element according to a control signal that at least partially depends on a reference pulse repetition rate of the radiation system;

receiving pulse information; and, using the pulse information to determine and apply an adjustment to the control signal.

22. A computer program comprising computer readable instructions configured to cause a computer to carry out a method of controlling pulses of radiation comprising:

using an optical element to interact with the pulses of radiation to control a characteristic of the pulses of radiation;

using an actuator to actuate the optical element according to a control signal that at least partially depends on a reference pulse repetition rate of the radiation system;

receiving pulse information; and, using the pulse information to determine and apply an adjustment to the control signal.

23. A computer apparatus for controlling pulses of radiation comprising a memory storing processor readable instructions, and a processor arranged to read and execute instructions stored in said memory, wherein said processor readable instructions comprise instructions arranged to control the computer to carry out a method of controlling pulses of radiation comprising: using an optical element to interact with the pulses of radiation to control a characteristic of the pulses of radiation;

using an actuator to actuate the optical element according to a control signal that at least partially depends on a reference pulse repetition rate of the radiation system;

receiving pulse information; and, using the pulse information to determine and apply an adjustment to the control signal.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A radiation system for controlling pulses of radiation, the radiation system comprising:
    an optical element configured to interact with the pulses of radiation to control a characteristic of the pulses of radiation;
    a controller configured to receive pulse information including a reference pulse repetition rate of the radiation system, determine an adjustment to a control signal based on the received pulse information and at least partially depending on the reference pulse repetition rate of the radiation system, and apply the adjustment to a control signal; and
    an actuator configured to actuate the optical element according to the control signal received from a controller,
    wherein the adjustment applied to the control signal by the controller thereby changes a magnitude of the control signal, and the magnitude of the control signal in the frequency domain depends at least partly on a target wavelength of the pulses of radiation and a dynamic model of the actuator in the frequency domain.

2. The radiation system of claim 1, wherein the characteristic is a wavelength of the pulses of radiation.

3. The radiation system of claim 1, wherein the pulse information includes an operational pulse repetition rate of the radiation system and wherein the adjustment at least partially accounts for a difference between the reference pulse repetition rate and the operational pulse repetition rate.

4. The radiation system of claim 1, wherein the magnitude of the control signal is:

$$|U(f)| = \frac{\lambda_T(n)}{|P(f)|}$$

where U(f) is the control signal of the actuator in the frequency domain, $\lambda_T$ is a target wavelength of the pulses of radiation, n is the pulse number and P(f) is a dynamic model of the actuator in the frequency domain.

5. The radiation system of claim 4, wherein the pulse information includes a pulse number and wherein the changed magnitude of the control signal is:

$$|U(f)|_A = \frac{\lambda_T(n)}{|P(f)|} \times C$$

where C is a correction factor.

6. The radiation system of claim 5, wherein the correction factor is:

$$C = \frac{1}{\cos(2\pi \times R_r \times \Delta \times n)}$$

where $R_r$ is the reference pulse repetition rate of the radiation system and $\Delta$ is a difference between the operational pulse repetition rate and the reference pulse repetition rate.

7. The radiation system of claim 6, wherein the correction factor is calculated and applied to the control signal for each pulse of radiation generated by the radiation system.

8. The radiation system of claim 1, wherein the actuator comprises a piezoelectric element configured to rotate the optical element such that an angle of incidence of the pulses of radiation on the optical element changes.

9. The radiation system of claim 1, wherein the optical element comprises a grating configured to reflect the pulses of radiation in a wavelength dependent manner such that a selected band of wavelengths of radiation are transmitted to an output of the radiation system.

10. The radiation system of claim 1, wherein the optical element comprises a prism configured to refract the pulses of radiation in a wavelength dependent manner such that a selected band of wavelengths of radiation are transmitted to the output of the radiation system.

11. A lithographic system comprising:
    a lithographic apparatus configured to receive pulses of radiation, pattern the pulses of radiation, and project the patterned pulses of radiation onto a target; and,
    a radiation system according to claim 1.

12. A method of controlling pulses of radiation, the method comprising:
    using an optical element to interact with the pulses of radiation to control a characteristic of the pulses of radiation;
    using an actuator to actuate the optical element according to a control signal that at least partially depends on a reference pulse repetition rate of the pulses of radiation;

receiving pulse information; and, using the pulse information to determine and apply an adjustment to the control signal;

wherein applying the adjustment to the control signal comprises changing a magnitude of the control signal, the magnitude of the control signal in the frequency domain depending at least partly on a target wavelength of the pulses of radiation and a dynamic model of the actuator in the frequency domain.

13. The method of claim 12, wherein the characteristic is a wavelength of the pulses of radiation.

14. The method of claim 13, wherein the pulse information includes an operational pulse repetition rate of the pulses of radiation system and wherein the adjustment at least partially accounts for a difference between the reference pulse repetition rate and the operational pulse repetition rate.

15. The method of claim 12, wherein the magnitude of the control signal is:

$$|U(f)| = \frac{\lambda_T(n)}{|P(f)|}$$

where $U(f)$ is the control signal of the actuator, $\lambda_T$ is a target wavelength of the pulses of radiation, n is the pulse number and $P(f)$ is a dynamic model of the actuator.

16. A method of projecting a patterned beam of radiation onto a target, wherein the patterned beam of radiation comprises pulses of radiation, the method further comprising controlling the pulses of radiation according a method comprising:

using an optical element to interact with the pulses of radiation to control a characteristic of the pulses of radiation;

using an actuator to actuate the optical element according to a control signal that at least partially depends on a reference pulse repetition rate of the pulses of radiation;

receiving pulse information; and, using the pulse information to determine and apply an adjustment to the control signal;

wherein applying the adjustment to the control signal comprises changing a magnitude of the control signal, the magnitude of the control signal in the frequency domain depending at least partly on a target wavelength of the pulses of radiation and a dynamic model of the actuator in the frequency domain.

17. A computer program comprising computer readable instructions configured to cause a computer to carry out a method of controlling pulses of radiation, the method comprising:

using an optical element to interact with the pulses of radiation to control a characteristic of the pulses of radiation;

using an actuator to actuate the optical element according to a control signal that at least partially depends on a reference pulse repetition rate of the pulses of radiation;

receiving pulse information; and, using the pulse information to determine and apply an adjustment to the control signal;

wherein applying the adjustment to the control signal comprises changing a magnitude of the control signal, the magnitude of the control signal in the frequency domain depending at least partly on a target wavelength of the pulses of radiation and a dynamic model of the actuator in the frequency domain.

18. A computer apparatus for controlling pulses of radiation, the computer apparatus comprising a memory storing processor readable instructions, and a processor arranged to read and execute instructions stored in said memory, wherein said processor readable instructions comprise instructions arranged to control the computer to carry out a method of controlling pulses of radiation, the method comprising:

using an optical element to interact with the pulses of radiation to control a characteristic of the pulses of radiation;

using an actuator to actuate the optical element according to a control signal that at least partially depends on a reference pulse repetition rate of the pulses of radiation system;

receiving pulse information; and, using the pulse information to determine and apply an adjustment to the control signal;

wherein applying the adjustment to the control signal comprises changing a magnitude of the control signal, the magnitude of the control signal in the frequency domain depending at least partly on a target wavelength of the pulses of radiation and a dynamic model of the actuator in the frequency domain.

* * * * *